United States Patent
Ho et al.

(10) Patent No.: US 9,893,188 B2
(45) Date of Patent: Feb. 13, 2018

(54) SEMICONDUCTOR STRUCTURE WITH TEMPLATE FOR TRANSITION METAL DICHALCOGENIDES CHANNEL MATERIAL GROWTH

(71) Applicants: Taiwan Semiconductor Manufacturing Company Limited, Hsinchu (TW); National Chiao-Tung University, Hsinchu (TW)

(72) Inventors: Yen-Teng Ho, Tainan (TW); Yi Chang, Hsinchu County (TW)

(73) Assignees: Taiwan Semiconductor Manufacturing Company Limited, Hsinchu (TW); National Chiao-Tung University, Hsinchu (TW)

( * ) Notice: Subject to any disclaimer, the term of this patent is extended or adjusted under 35 U.S.C. 154(b) by 0 days.

(21) Appl. No.: 15/146,125

(22) Filed: May 4, 2016

(65) Prior Publication Data
US 2016/0247923 A1 Aug. 25, 2016

Related U.S. Application Data

(62) Division of application No. 14/326,575, filed on Jul. 9, 2014, now Pat. No. 9,349,806.

(51) Int. Cl.
*H01L 29/06* (2006.01)
*H01L 29/78* (2006.01)
(Continued)

(52) U.S. Cl.
CPC ...... *H01L 29/7849* (2013.01); *H01L 21/0242* (2013.01); *H01L 21/0262* (2013.01); *H01L 21/02378* (2013.01); *H01L 21/02381* (2013.01); *H01L 21/02389* (2013.01); *H01L 21/02433* (2013.01); *H01L 21/02447* (2013.01); *H01L 21/02458* (2013.01); *H01L 21/02568* (2013.01); *H01L 21/02631* (2013.01); *H01L 21/02661* (2013.01); *H01L 21/383* (2013.01); *H01L 29/04* (2013.01); *H01L 29/045* (2013.01); *H01L 29/1608* (2013.01); *H01L 29/24* (2013.01); *H01L 29/66969* (2013.01); *H01L 29/7781* (2013.01); *H01L 29/267* (2013.01)

(58) Field of Classification Search
None
See application file for complete search history.

(56) References Cited

U.S. PATENT DOCUMENTS

2005/0074576 A1 4/2005 Chaiken et al.
2011/0108853 A1 5/2011 Adachi et al.
(Continued)

OTHER PUBLICATIONS

Loher, Thomas, Koma, Atsushi; Epitaxial Growth of ZnSe on Si(111) with Lattice-Matched Layered InSe Buffer Layers; Japanese Journal of Applied Physics, 37(2); pp. L-1062-L1064; Sep. 1998.

*Primary Examiner* — Shaun Campbell
(74) *Attorney, Agent, or Firm* — Jones Day

(57) ABSTRACT

A semiconductor structure includes a substrate, a buffer layer, and a two-dimensional layered material. The buffer layer is above the substrate and is formed from one of SiC and a nitride-based material. The two-dimensional layered material is above the buffer material. The construction as such permits formation, e.g., of a channel of a transistor from the two-dimensional layered material.

19 Claims, 5 Drawing Sheets

(51) Int. Cl.
    *H01L 29/24*     (2006.01)
    *H01L 29/04*     (2006.01)
    *H01L 29/66*     (2006.01)
    *H01L 21/02*     (2006.01)
    *H01L 21/383*     (2006.01)
    *H01L 29/778*     (2006.01)
    *H01L 29/16*     (2006.01)
    *H01L 29/267*     (2006.01)

(56) References Cited

U.S. PATENT DOCUMENTS

| | | | | |
|---|---|---|---|---|
| 2014/0014965 A1* | 1/2014 | Kraus | ................ | H01L 21/0262 257/76 |
| 2014/0306184 A1* | 10/2014 | Ruhl | ................... | H01L 29/1606 257/29 |
| 2015/0014631 A1* | 1/2015 | Ohlsson | ............. | H01L 21/0237 257/24 |
| 2015/0294875 A1* | 10/2015 | Khondaker | ....... | H01L 21/02175 257/411 |
| 2016/0141372 A1* | 5/2016 | Sasaki | .................... | H01L 29/78 257/43 |

* cited by examiner

SEMICONDUCTOR STRUCTURE WITH TEMPLATE FOR TRANSITION METAL DICHALCOGENIDES CHANNEL MATERIAL GROWTH

CROSS-REFERENCE TO RELATED APPLICATION

This application is a divisional of U.S. patent application Ser. No. 14/326,575, filed Jul. 9, 2014, which is incorporated herein by reference in its entirety.

BACKGROUND

The technology described in this patent document relates to transition metal dichalcogenides, and more specifically to forming semiconductor structures with transition metal dichalcogenides material as channel material.

Scaling of semiconductor devices, such as a MOSFET, has enabled continued improvement in speed, performance, density, and cost per unit function of integrated circuits over the past few decades. Two-dimensional transition metal dichalcogenides (TMDC) materials such as $MoS_2$ exhibit quantum confinement effect and are a promising channel material for FETs in low power consumption applications.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
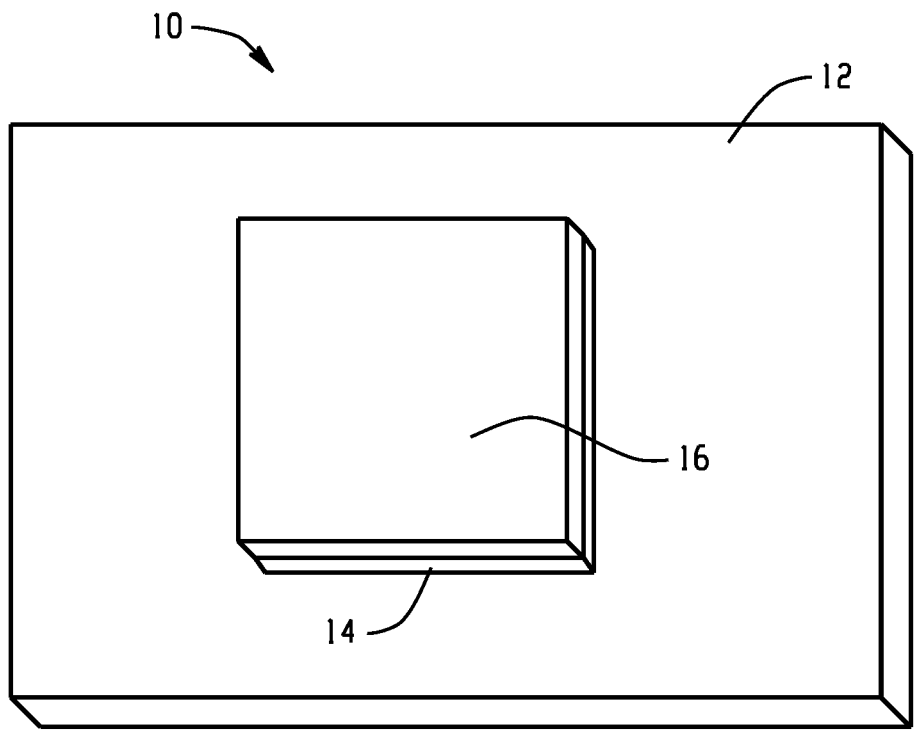
FIG. 1A depicts an example semiconductor structure with TMDC material as channel material.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Two-dimensional transition metal dichalcogenides (TMDC) materials such as $MoS_2$, exhibit desirable characteristics such as high channel mobility (~200 $cm^2/Vs$ in some examples), a high current ON/OFF ratio (~$10^8$ in some examples), and a good sub-threshold swing (~70 mV per decade in some examples). It may be desirable to use TMDC materials as channel material in FETs. Developing a large-area growth method for TMDC materials can make it easier to fabricate FETs with TMDC material as channel material. Semiconductor structures and methods for fabricating semiconductor structures are disclosed which provide TMDC materials as channel material.

FIG. 1A depicts an example semiconductor structure 10 with TMDC material as channel material. The semiconductor structure 10 comprises a single crystal substrate 12. Examples of single crystal substrate materials that may be used include Si(111), 4H-SiC(0001), sapphire(0001) and AlN(0001). In this example, the single crystal substrate 12 comprises sapphire(0001).

The semiconductor structure 10 also includes a layer of channel layer material 16 from which the channel of a transistor may be formed. The channel layer 16 is formed above the substrate 12 from a transition metal dichalcogenides (TMDC) material. TMDCs are a class of materials with the chemical formula $MX_2$, where M represents a transition metal element from group IV (e.g., Ti, Zr, Hf, etc.), group V (e.g., V, Nb or Ta) or group VI (e.g., Mo, W, etc.). The ternary compound of transition metal elements to form dichalcogenides is also included such as MoWS2, etc. The X represents a chalcogen (e.g., S, Se or Te). In this example, the channel material comprises $MoS_2$.

The semiconductor structure 10 further includes a buffer layer 14 formed between the substrate 12 and the channel layer 16. The buffer layer 14 is a single crystal epitaxial buffer layer formed between the substrate and the channel layer 16. The buffer layer 14 is formed from material having a lattice constant mismatch of less than 5% with the lattice constant of the channel layer material. The buffer layer may be formed from materials such as AlN(0001), GaN(0001), InGaN(001), InAlN(0001), BN(0001), TiN(111), and SiC (0001), which may reduce misfit dislocation density for the TMDC channel material. In this example, the buffer layer comprises AlN(0001).

Figure 1B:
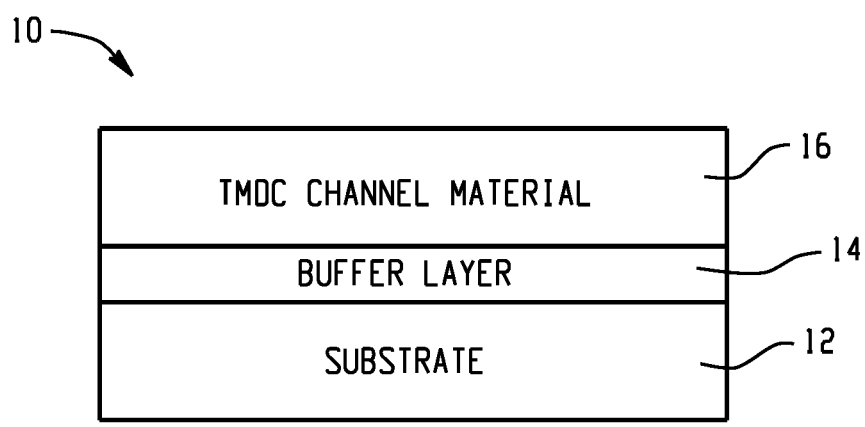
FIG. 1B depicts a cross-sectional view of the example semiconductor structure.

FIG. 1B depicts a cross-sectional view of the example semiconductor structure 10. In this example, the substrate 12 comprises sapphire(0001), the buffer layer 14 comprises AlN(0001), and the channel material 16 comprises MoS2.

Figure 2:
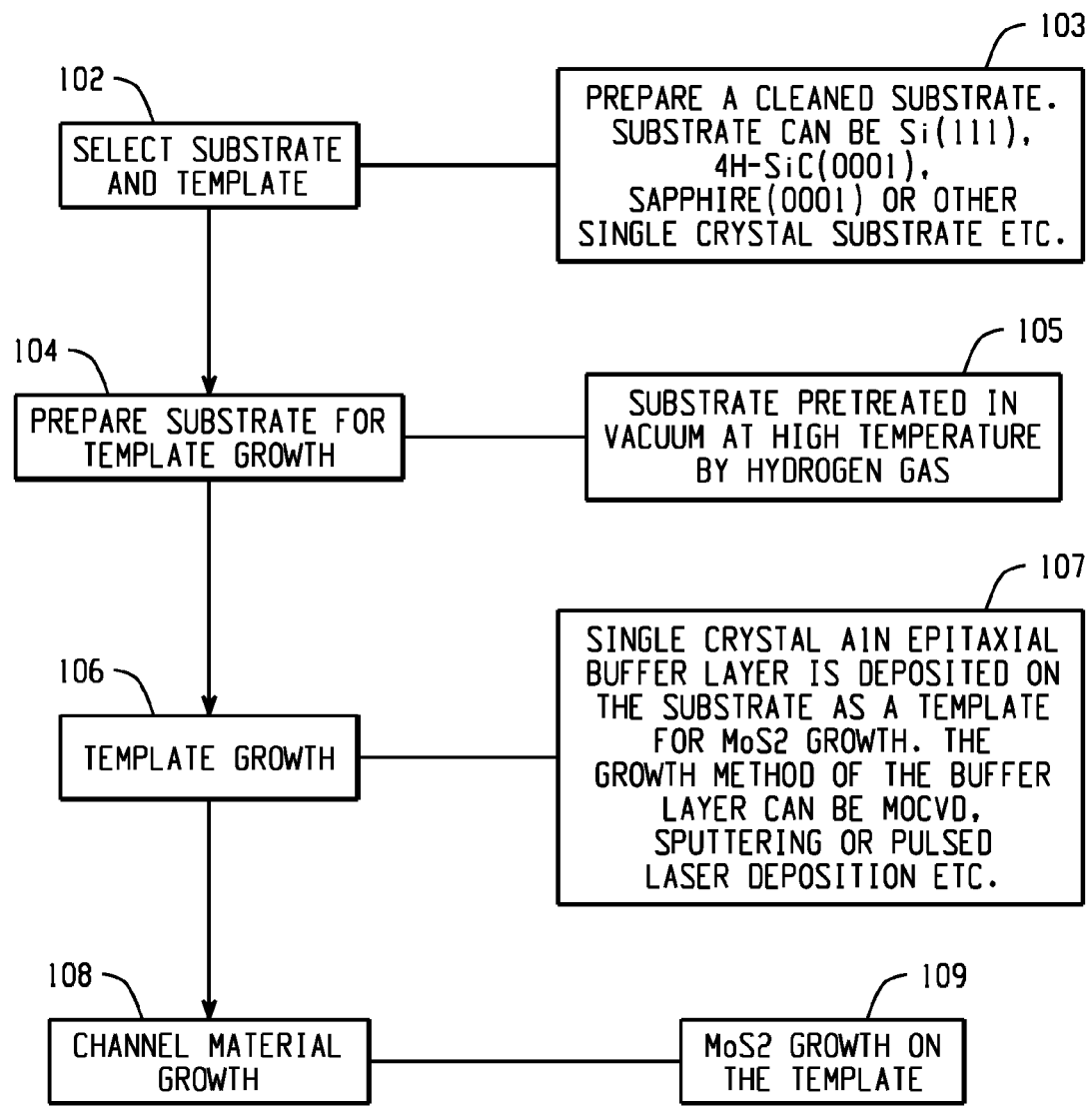
FIG. 2 depicts a process flow chart illustrating an example process for forming a semiconductor structure with TMDC material as channel material.

FIG. 2 is a process flow diagram illustrating an example process for forming a semiconductor structure with TMDC material as channel material. A substrate and template for channel material growth are selected (operation 102). The substrate is formed from a single crystal material, such as Si(111), 4H-SiC(0001), sapphire(0001) or other single crystal substrate (option 103). In this example, the substrate is also cleaned.

After substrate selection, the substrate is prepared for template growth (operation 104). Preparation may involve pre-treating the substrate with hydrogen gas in a vacuum environment at a high temperature (option 105).

After substrate preparation, a template is grown on the substrate as a buffer layer (operation 106). The buffer layer is formed from a single crystal material. In the example illustrated, a single crystal AlN epitaxial buffer layer is deposited on the substrate as a template for $MoS_2$ growth (option 107). The growth method of the buffer layer can be MOCVD, sputtering or pulsed laser deposition, among others.

After template growth, channel material is grown on the template (operation 108). In this example, the channel material comprises $MoS_2$ (option 109). A transistor or other semiconductor device can be fabricated using the semiconductor structure formed by the example process.

Figure 3:
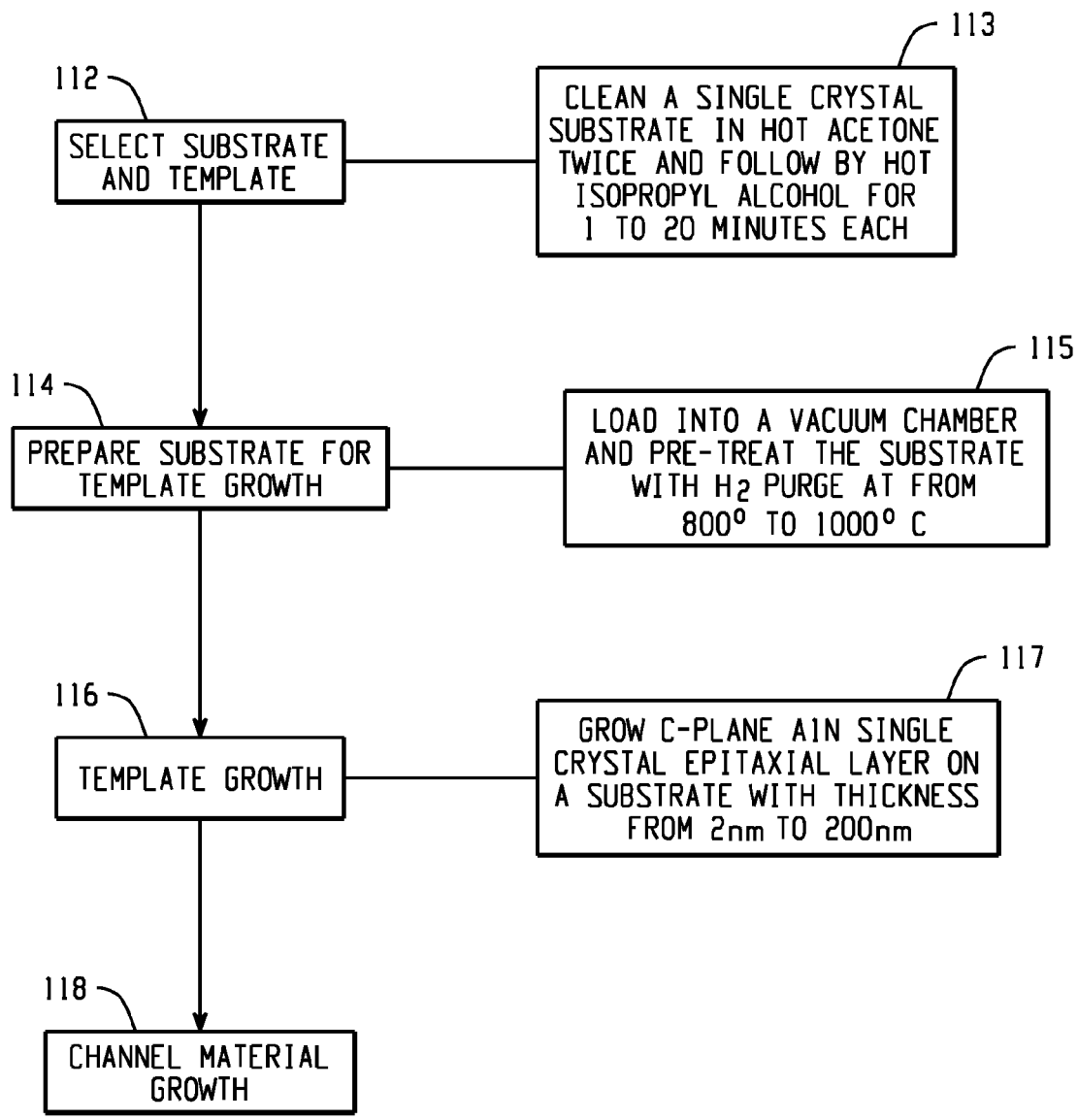
FIG. 3 depicts a process flow chart illustrating another example process for forming a semiconductor structure with TMDC material as channel material.

FIG. 3 is a process flow diagram illustrating another example process for forming a semiconductor structure with TMDC material as channel material. A substrate and template for channel material growth are selected (operation 112). In this example, the substrate is formed from a single crystal material and undergoes two cleanings in hot acetone and a cleaning using hot isopropyl alcohol (option 113).

After substrate selection, the substrate is prepared for template growth (operation 114). Preparation may involve pre-treating the substrate with a hydrogen gas ($H_2$) purge in a vacuum environment at a temperature of around 800-1000° C. (option 115).

After substrate preparation, a template is grown on the substrate as a buffer layer (operation 116). In the example illustrated, a c-plane AlN single crystal epitaxial layer is grown on the substrate with a thickness of about 2 nm to 200 nm (option 117).

After template growth, channel material is grown on the template (operation 118). A transistor or other semiconductor device can be fabricated using the semiconductor structure formed by the example process.

Figure 4:
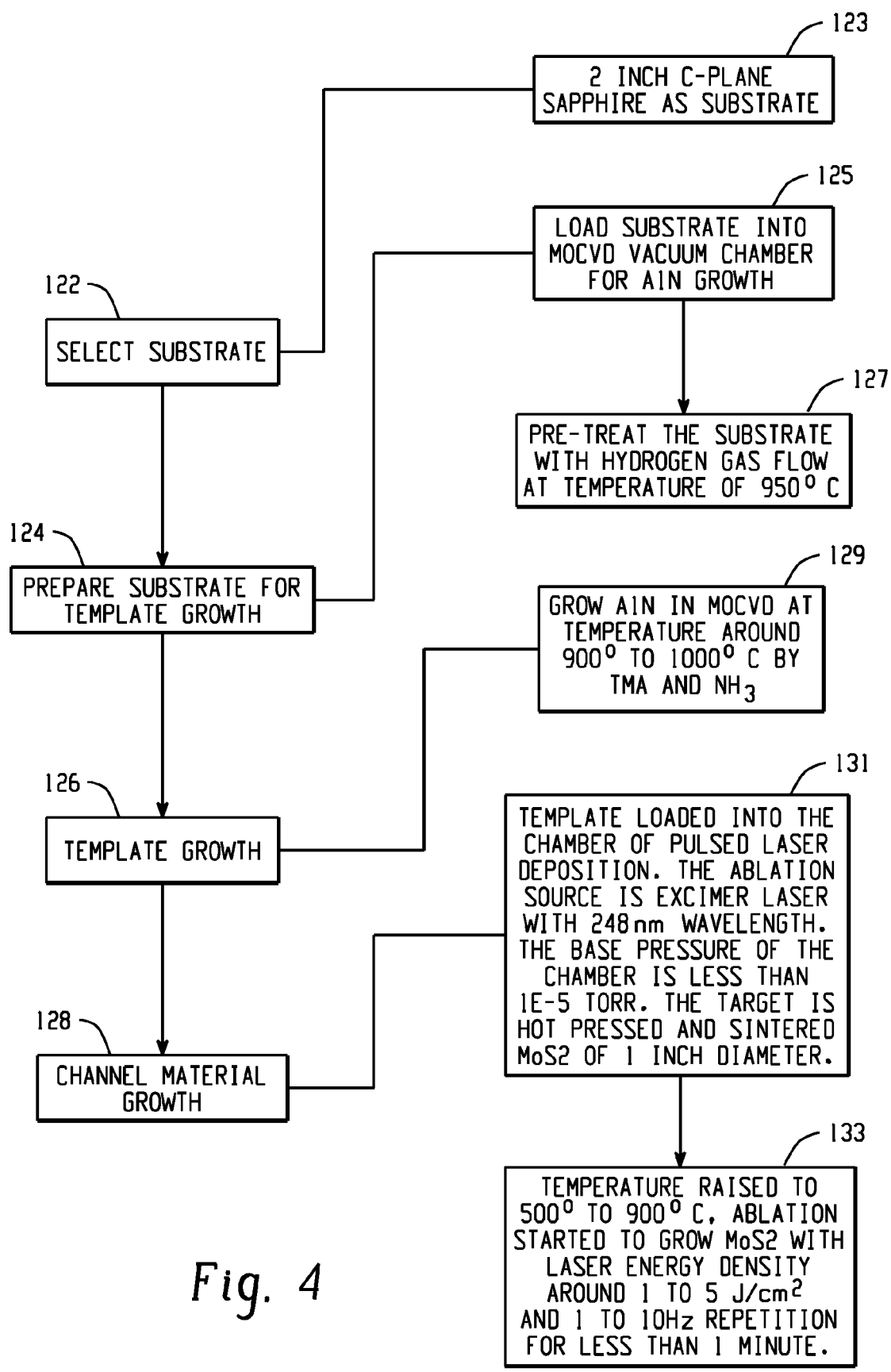
FIG. 4 depicts a process flow chart illustrating another example process for forming a semiconductor structure with TMDC material as channel material.

FIG. 4 is a process flow diagram illustrating another example process for forming a semiconductor structure with TMDC material as channel material. A substrate and template for channel material growth are selected (operation 122). The substrate, in this example, comprises 2" c-plane sapphire (option 123).

After substrate selection, the substrate is prepared for template growth (operation 124). Preparation may involve loading the substrate into a metal organic chemical vapor deposition (MOCVD) vacuum chamber for AlN growth (option 125) and pre-treating the substrate with a hydrogen gas ($H_2$) flow in the vacuum chamber at a temperature of around 950° C. (option 127).

After substrate preparation, a template is grown on the substrate as a buffer layer (operation 126). In the example illustrated, an AlN single crystal epitaxial layer is grown in the MOCVD vacuum chamber at a temperature of around 900-1000° C. by Al precursor Trimethylaluminum (referred to as TMA or $(CH3)_3Al$) and nitrogen precursor Ammonia (NH3) (option 129).

After template growth, the surface of AlN can be treated by a sulfurization process to form a sulfur termination on the template surface. The sulfurization process may comprise pretreatment using $H_2S$ gas or Sulfur vapor ambient at a temperature of around 500-1000° C.

After template growth, channel material is grown on the template (operation 128). In this example, channel material growth involves pulse laser deposition in a chamber wherein the ablation source is a 248 nm wavelength excimer laser, the chamber pressure is less than 1 E-5 torr, and the target is hot pressed and sintered $MoS_2$ of a 1 inch diameter (option 131). Ablation is performed at a temperature of approximately 500-900° C. and a laser energy density of approximately 1-5 $J/cm^2$ (option 133). A transistor or other semiconductor device can be fabricated using the semiconductor structure formed by the example process.

In any of the foregoing example processes, the channel material may be formed from a transition metal dichalcogenides (TMDC) material, wherein the buffer layer material has a lattice constant mismatch of less than 5% with the lattice constant of the channel layer material. In any of the foregoing example processes, the substrate may comprise a Si(111), 4H-SiC(0001), or sapphire(0001) single crystal substrate.

Figure 5:
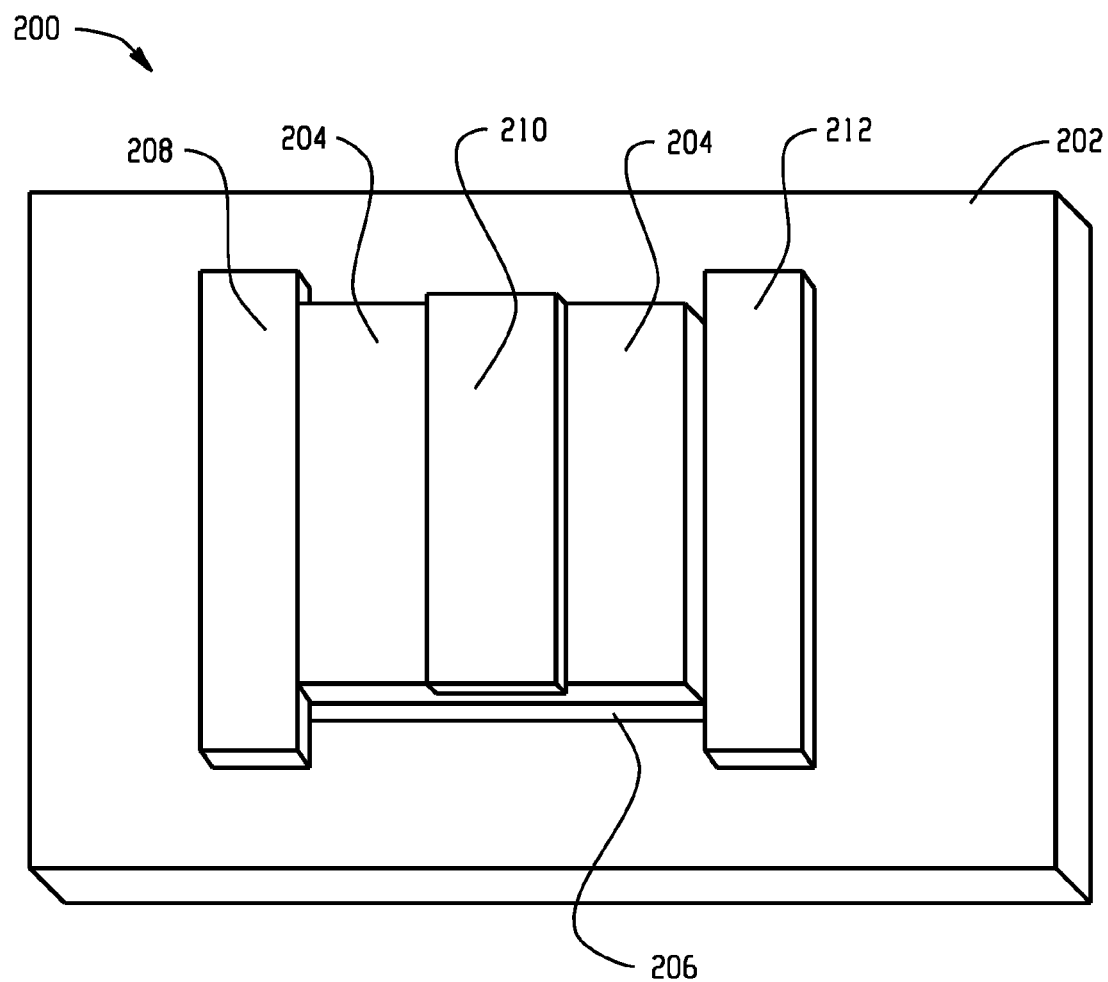
FIG. 5 depicts a top down view of an example semiconductor structure with TMDC material as channel material formed using one or more of the example processes.

FIG. 5 depicts a top down view of an example semiconductor structure 200 formed using one or more of the example processes. The example semiconductor structure 200 comprises a single crystal substrate 202. Examples of single crystal substrate materials include Si(111), 4H-SiC (0001), sapphire(0001) and AlN(0001).

The semiconductor structure 200 also includes a layer of channel layer material 204 from which the channel of a transistor may be formed. The channel layer 204 is formed above the substrate 202 from a transition metal dichalcogenides (TMDC) material. The chemical formula of the TMDC channel material comprises $MX_2$, wherein the M represents a transition metal element from group IV, group V, or group VI, and the X represents a chalcogen such as S, Se or Te.

The semiconductor structure 200 further includes a buffer layer 206 formed between the substrate 202 and the channel layer 204. The buffer layer 206 is a single crystal epitaxial buffer layer formed between the substrate and the channel layer 204. The buffer layer 206 is formed from material having a lattice constant mismatch of less than 5% with the lattice constant of the channel layer material. The buffer layer was grown on the substrate by metal organic chemical vapor deposition (MOCVD), sputtering or pulsed laser deposition. The buffer layer may comprise AlN(0001), GaN (0001), InGaN(001), InAlN(0001), BN(0001), TiN(111), or SiC(0001).

Also illustrated are transistor terminals for the semiconductor structure. Shown are a source region 208, a gate region 210, and a drain region 212. In the example illustrated, the substrate comprises sapphire(0001), the buffer layer comprises AlN(0001), and the channel material comprises $MoS_2$. Also, in the example illustrated, the substrate was pre-treated with hydrogen gas in a vacuum at high temperature prior to buffer layer formation.

The methods and structures disclosed herein can provide easier $MoS_2$ nucleation and epitaxy, a high crystalline quality of $MoS_2$ growth, and may be suitable for large area epitaxy.

In one embodiment, a semiconductor structure comprises a substrate, a buffer layer above the substrate and formed from one of SiC and a nitride-based material, and a two-dimensional layered material above the buffer layer.

In another embodiment, a semiconductor structure comprises a substrate, a two-dimensional layered material above the substrate, a buffer layer between the substrate and the two-dimensional layered material, and a sulfur termination formed on a surface of the buffer layer.

In yet another embodiment, a semiconductor structure comprises a substrate, a buffer layer above the substrate, and a transistor including a channel above the buffer layer and formed from a two-dimensional layered material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
a substrate;
a two-dimensional layered material above the substrate;
a buffer layer between the substrate and the two-dimensional layered material; and
a sulfur termination formed on a surface of the buffer layer.

2. The semiconductor structure of claim 1, further comprising a transistor including a channel formed from the two-dimensional layered material.

3. The semiconductor structure of claim 1, wherein the two-dimensional layered material is a transition metal dichalcogenides (TMDC) material.

4. The semiconductor structure of claim 1, wherein the substrate is pre-treated with a hydrogen gas.

5. The semiconductor structure of claim 1, wherein the buffer layer is formed from SiC.

6. The semiconductor structure of claim 1, wherein the buffer layer is formed from a nitride-based material.

7. A semiconductor structure comprising:
a substrate;
a buffer layer above the substrate, wherein the buffer layer is a c-plane buffer layer; and
a transistor including a channel above the buffer layer and formed from a two-dimensional layered material, wherein the two-dimensional layered material is a transition metal dichalcogenides (TMDC) material.

8. The semiconductor structure of claim 7, wherein the TMDC material is $MoS_2$.

9. The semiconductor structure of claim 7, wherein the buffer layer has a thickness of about 2 nm to about 200 nm.

10. The semiconductor structure of claim 7, wherein the substrate is pre-treated with a hydrogen gas.

11. A semiconductor structure comprising:
a substrate;
a buffer layer above the substrate, wherein the buffer layer is a c-plane buffer layer, wherein the buffer layer is formed from SiC; and
a transistor including a channel above the buffer layer and formed from a two-dimensional layered material.

12. The semiconductor structure of claim 7, wherein the buffer layer is formed from a nitride-based material.

13. The semiconductor structure of claim 12, wherein the nitride-based material is AN.

14. A semiconductor structure comprising:
a substrate;
a buffer layer above the substrate;
a transistor including a channel above the buffer layer and formed from a two-dimensional layered material; and
a sulfur termination formed on a surface of the buffer layer.

15. The semiconductor structure of claim 14, wherein the two-dimensional layered material is a transition metal dichalcogenides (TMDC) material.

16. The semiconductor structure of claim 1, the buffer layer being formed from AlN.

17. The semiconductor structure of claim 1, further comprising a transistor including a channel formed from the two-dimensional layered material.

18. The semiconductor structure of claim 11, wherein the two-dimensional layered material is a transition metal dichalcogenides (TMDC) material.

19. The semiconductor structure of claim 11, wherein the substrate is pre-treated with a hydrogen gas.

* * * * *